(12) United States Patent
Salahuddin et al.

(10) Patent No.: US 11,837,211 B2
(45) Date of Patent: Dec. 5, 2023

(54) MAGNETIC FIELD SENSOR USING ACOUSTICALLY DRIVEN FERROMAGNETIC RESONANCE

(71) Applicant: THE REGENTS OF THE UNIVERSITY OF CALIFORNIA, Oakland, CA (US)

(72) Inventors: Sayeef Salahuddin, Walnut Creek, CA (US); Dominic E. Labanowski, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 507 days.

(21) Appl. No.: 16/464,066

(22) PCT Filed: Dec. 11, 2017

(86) PCT No.: PCT/US2017/065607
§ 371 (c)(1),
(2) Date: May 24, 2019

(87) PCT Pub. No.: WO2018/111769
PCT Pub. Date: Jun. 21, 2018

(65) Prior Publication Data
US 2019/0385586 A1   Dec. 19, 2019

Related U.S. Application Data

(60) Provisional application No. 62/434,122, filed on Dec. 14, 2016.

(51) Int. Cl.
*G10K 11/36*   (2006.01)
*G01R 33/18*   (2006.01)
(Continued)

(52) U.S. Cl.
CPC .............. *G10K 11/36* (2013.01); *G01N 24/10* (2013.01); *G01R 33/18* (2013.01); *B06B 1/06* (2013.01);
(Continued)

(58) Field of Classification Search
CPC ........ G10K 11/36; G01N 24/10; G01N 27/72; G01N 29/02; G01N 29/022; G01R 33/18;
(Continued)

(56) References Cited

U.S. PATENT DOCUMENTS 4,078,186 A * 3/1978 Folen ..................... G10K 11/36
310/26
4,177,438 A * 12/1979 Vittoria .................. H03H 9/426
333/152
(Continued)

FOREIGN PATENT DOCUMENTS

| CN | 101064014 A | 10/2007 |
| CN | 101504446 B * | 4/2011 |
| CN | 102435959 A * | 5/2012 |

OTHER PUBLICATIONS

Shibayama et al., "Optimum Cut for Rotated Y-Cut LiNbO3 Crystal Used as the Substrate of Acoustic-Surface-Wave Filters", Proc. Of The IEEE, vol. 64, No. 5, p. 595-598, May, (Year: 1976).*
(Continued)

*Primary Examiner* — Leshui Zhang
(74) *Attorney, Agent, or Firm* — Miller Nash LLP

(57) ABSTRACT

An acoustically driven ferromagnetic resonance (ADFMR) device includes a piezoelectric element, a pair of transducers arranged to activate the piezoelectric element to generate an acoustic wave, a magnetostrictive element arranged to receive the acoustic wave, and a readout circuit to detect one of either a change in the magnetostrictive element or a change in the acoustic wave.

7 Claims, 13 Drawing Sheets

(51) Int. Cl.
*G01N 24/10* (2006.01)
*B06B 1/06* (2006.01)
*G01N 27/72* (2006.01)
*G01R 33/12* (2006.01)

(52) U.S. Cl.
CPC .......... *G01N 27/72* (2013.01); *G01R 33/1284* (2013.01)

(58) Field of Classification Search
CPC .. G01R 33/1284; G01R 33/12; G01R 33/096; G01R 33/09; G01R 33/0325; G01R 33/032; G01R 33/0327; G01R 33/075; G01R 33/07; G01R 33/02; B06B 1/06; H03H 9/02; H03H 9/02228; H03H 3/04
USPC ........ 324/228, 232, 233, 234, 235, 236, 244
See application file for complete search history.

(56) References Cited

U.S. PATENT DOCUMENTS

| | | | | |
|---|---|---|---|---|
| 5,456,113 | A * | 10/1995 | Kwun | G01N 29/2412 73/622 |
| 6,046,657 | A | 4/2000 | Alers et al. | |
| 6,279,406 | B1 * | 8/2001 | Li | G01R 33/02 73/861.08 |
| 6,339,276 | B1 * | 1/2002 | Barber | H03H 9/175 310/312 |
| 6,590,751 | B1 * | 7/2003 | Horng | B82Y 25/00 360/325 |
| 7,053,730 | B2 | 5/2006 | Park et al. | |
| 9,099,984 | B2 | 8/2015 | Reinhardt et al. | |
| 2001/0028245 | A1 * | 10/2001 | Li | G01R 33/02 324/312 |
| 2004/0126620 | A1 * | 7/2004 | Viehland | H01L 41/00 335/215 |
| 2007/0252593 | A1 * | 11/2007 | Takeuchi | G01R 33/18 324/249 |
| 2010/0164487 | A1 * | 7/2010 | Eyckmans | G11C 11/161 324/228 |
| 2010/0253326 | A1 * | 10/2010 | Koyilothu | G01R 33/091 324/207.21 |
| 2012/0218060 | A1 | 8/2012 | Burak et al. | |
| 2012/0256522 | A1 | 10/2012 | Ito et al. | |
| 2015/0318838 | A1 * | 11/2015 | Bhattacharjee | H03H 9/172 310/321 |
| 2016/0003924 | A1 * | 1/2016 | Sun | G01R 33/093 216/13 |

OTHER PUBLICATIONS

Dreher, et al., "Surface acoustic wave driven ferromagnetic resonance in nickel thin films: Theory and experiment," Physical Review B 86, 134415 13 pages, (Oct. 17, 2012).
Huang et al., "Theoretical investigation of magnetoelectric surface acoustic wave characteristics of ZnO/Metglas layered composite," AIP Advances 6, 015103, 7 pages, (Jan. 8, 2016).
International Search Report and Written Opinion, PCT/US2017/065607, dated Apr. 17, 2018.
Labanowski and Salahuddin, "Effect of Magnetoelastic film thickness on power absorption in acoustically driven ferromagnetic resonance," Appl. Phys. Lett. 111, 102904 (2017).
Labanowski et al., "Power absorption in acoustically driven ferromagnetic resonance," Appl. Phys. Lett. 108, 022905 (2016).

* cited by examiner

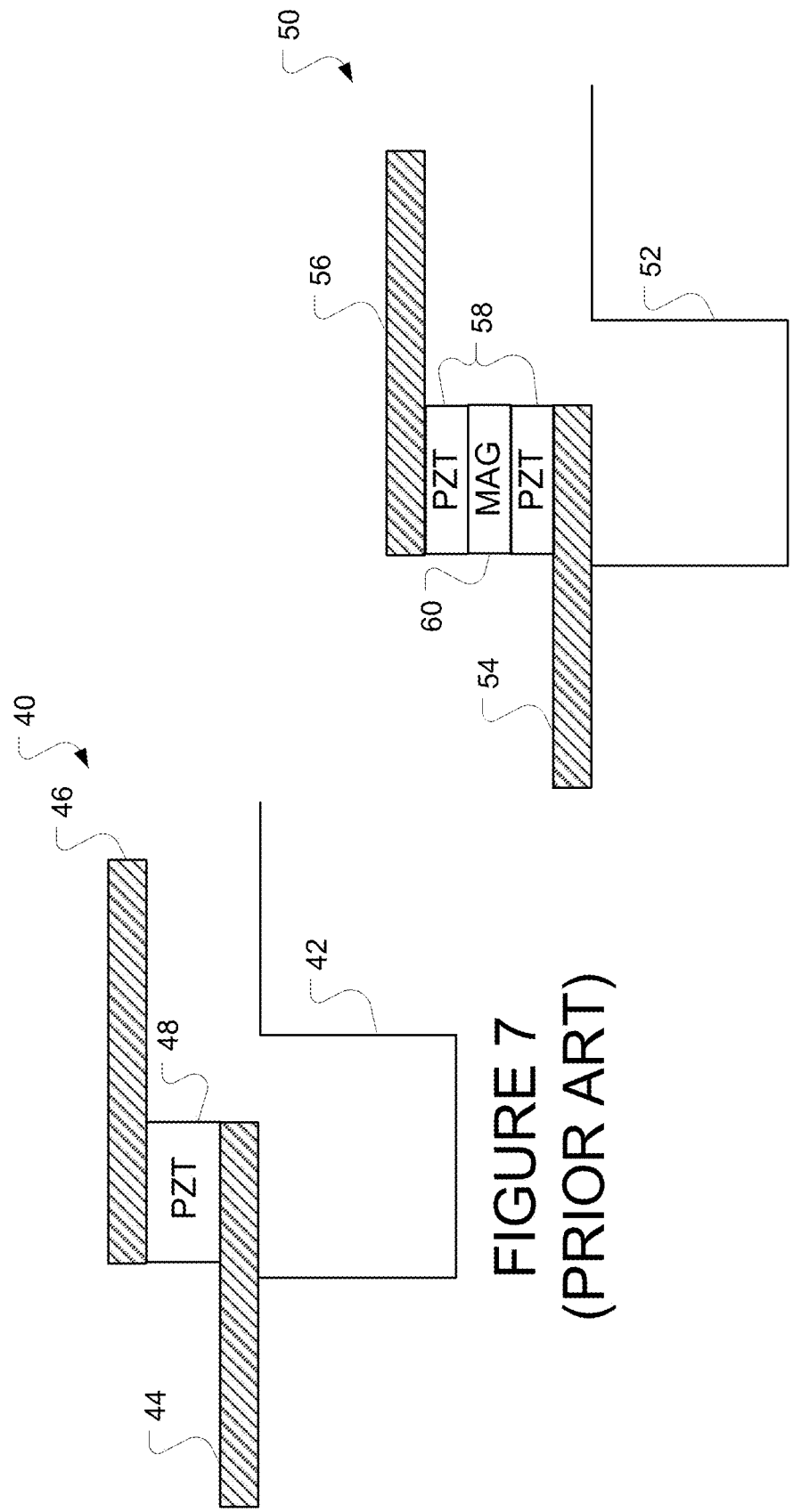

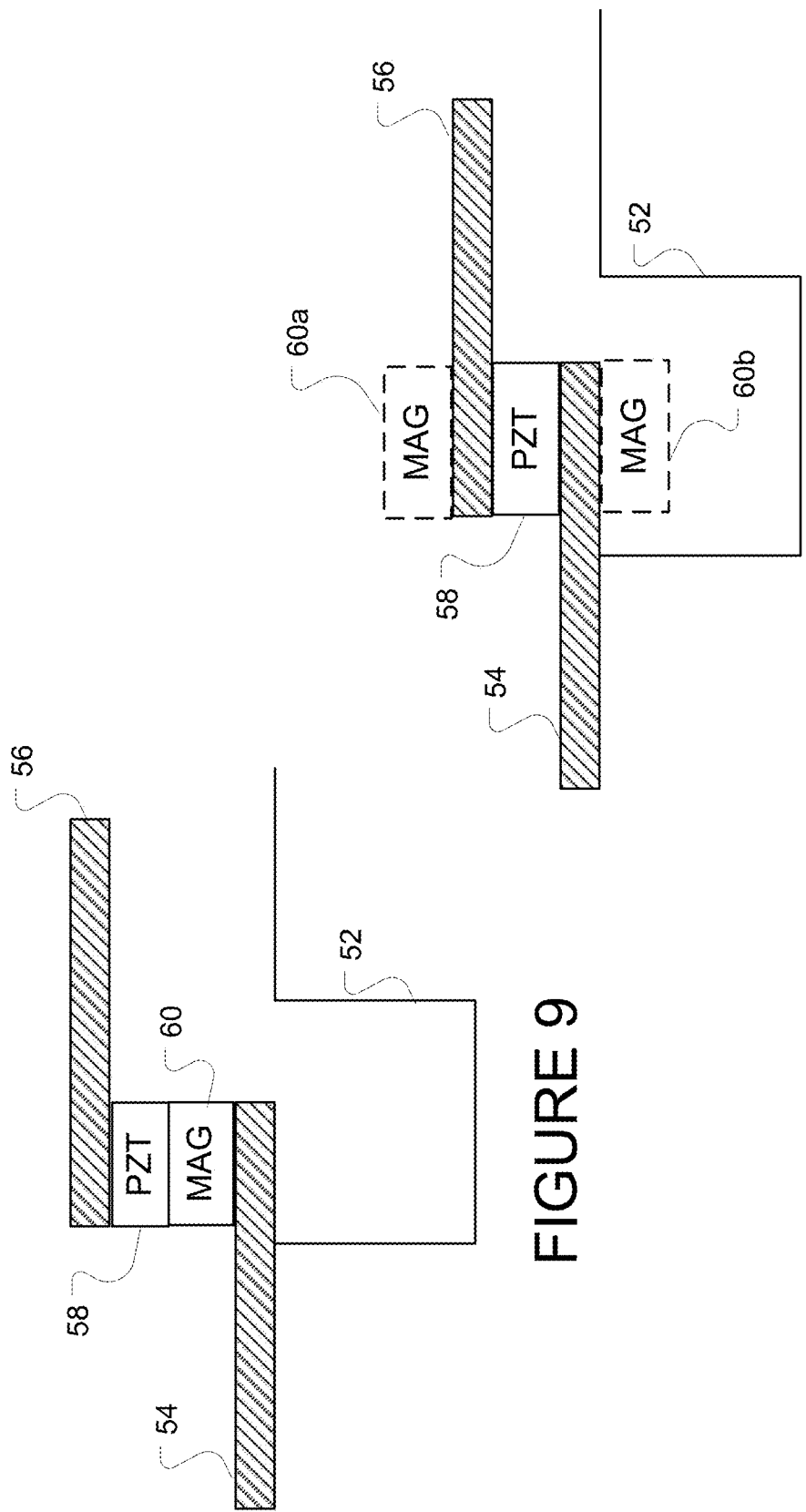

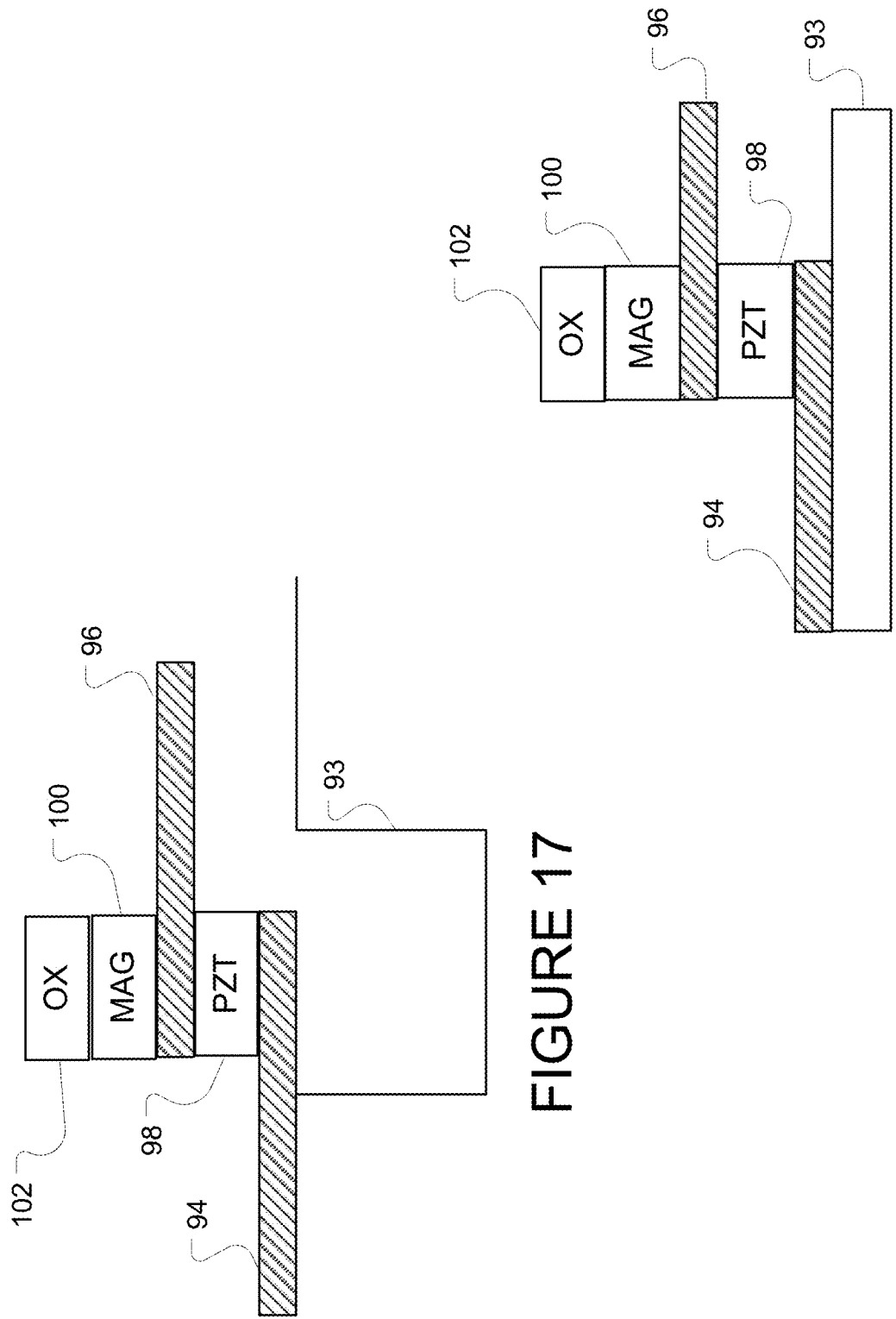

MAGNETIC FIELD SENSOR USING ACOUSTICALLY DRIVEN FERROMAGNETIC RESONANCE

CROSS-REFERENCE TO RELATED APPLICATIONS

This application is a 371 of International Application No. PCT/US2017/065607, filed Dec. 11, 2017, which claims priority to and the benefit of U.S. Provisional Application No. 62/434,122 filed Dec. 14, 2016, which is incorporated herein by reference in its entirety.

GOVERNMENT SUPPORT

This invention was made with government support under Grant Number 1160504 awarded by the National Science Foundation. The government has certain rights in the invention.

BACKGROUND

Ferromagnetic resonance (FMR) measures magnetic properties of materials by detecting the precessional motion in of the magnetization in a ferromagnetic sample. Different types of FMR include externally-driven FMR and current-driven FMR. FMR can be excited using a variety of techniques, like cavity excitation, stripline excitation, spin transfer torque, and spin orbit torque, among others These applications are typically not compatible with device applications. They require large cavities, high power drive and use large sample volume in order to be effective.

However, FMR has some attractive characteristics. These includes the ability to modulate material permeability and electromagnetic absorption as a function of magnetic applied field.

BRIEF DESCRIPTION OF THE DRAWINGS

FIGS. 7-11 show embodiments of an ADFMR device as a film bulk acoustic resonator (FBAR).

FIGS. 17-19 show embodiments of an ADFMR device having a structure on the magnetostrictive element.

DETAILED DESCRIPTION OF THE EMBODIMENTS

Figure 1:
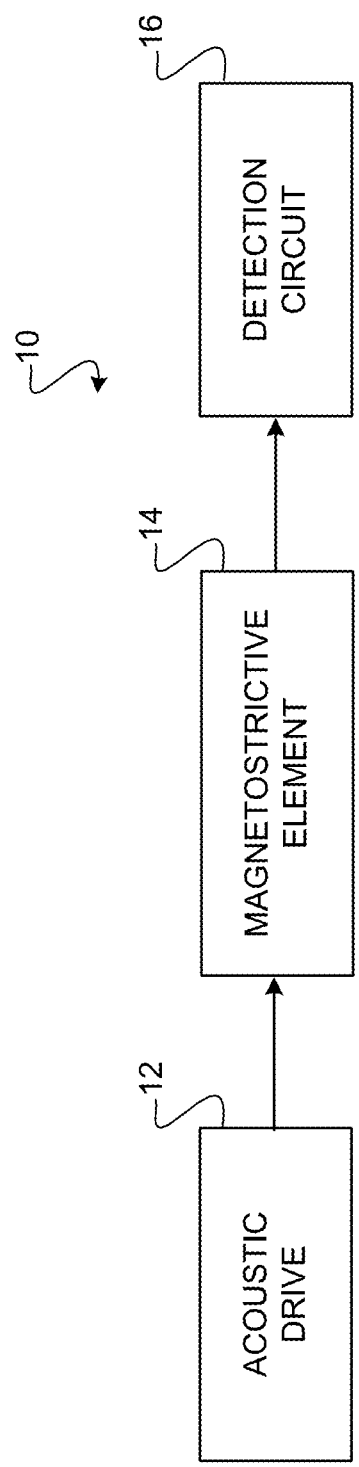
FIG. 1 shows a block diagram an embodiment of an acoustically driven ferromagnetic resonance device.

FIG. 1 shows a block diagram of an embodiment of an acoustically driven ferromagnetic device (ADFMR) 10. These devices may be used as field sensors by measuring transmitted power, among many other applications. The acoustic drive portion 12 of the device may consist of one of many different types of acoustic resonators, including surface acoustic wave (SAW) resonators, film bulk acoustic resonators (FBAR), and high-tone bulk acoustic resonators (HBAR).

The acoustic drive portion generates an acoustic wave at or near the ferromagnetic resonance of a magnetostrictive element, discussed in more detail below. As used here the phrase 'at the ferromagnetic resonance' includes a reasonable variation from the exact ferromagnetic resonance of the magnetostrictive element. The region of ferromagnetic resonance considered to be 'at the ferromagnetic resonance' is the region in which the FMR-related absorption is greater than 10%, approximately 0.4 dB. In addition, for purposes of this discussion and scope of the claims, the term 'ferromagnetic resonance' includes spin wave resonance. In addition, the acoustic drive portion generates the acoustic wave at a high enough frequency to reach the resonance range, typically in the 100s of MHz to GHz range.

Typically, the acoustic drive portion consists of at least one, but typically a pair of, transducers, such as electrodes, that activate a piezoelectric element to generate waves. A magnetostrictive element 14 receives the wave as a signal and changes its properties in response to the received wave. Detection circuitry 16 detects the change in the property of the magnetostrictive element and that change is used to determine a result. The detection circuitry may also measure the change in the wave generated by the acoustic drive portion 12.

Figure 2:
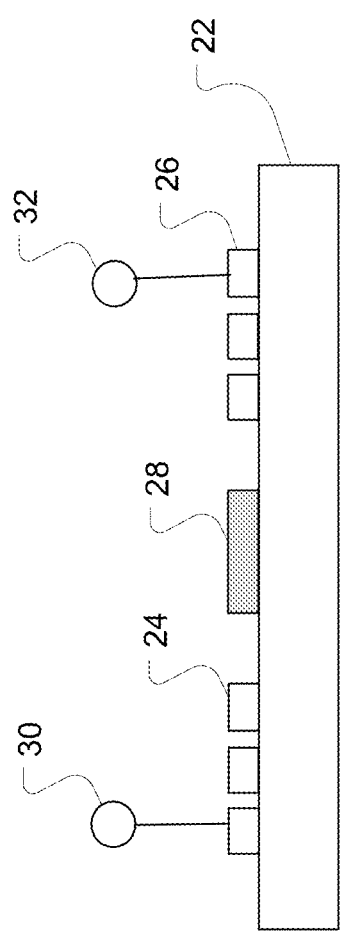
FIG. 2 shows an embodiment of an acoustically driven, surface acoustic wave, ferromagnetic resonance (ADFMR) device.

FIG. 2 shows a side view of an acoustically driven ferromagnetic resonance (ADFMR) device, using interdigitated transducers on a piezoelectric substrate with a magnetostrictive ferromagnet deposited between them. Application of an AC voltage to one of the transducers generates a coherent, elastic wave that travels along the surface of the substrate. The surface acoustic wave (SAW) interacts with the magnetic element via the magnetoelastic interaction and provides the radio frequency (RF) driving field necessary to excite the magnet into resonance.

One important feature of ADFMR devices lies in the fact that it is a voltage-driven effect, and thus is suitable for low-power applications. Since the piezoelectric generations of SAWs is based on the strength of the applied electric field, as opposed to electron flow through the device, ADFMR devices can operate with very low power dissipation. Experiments have found that significant power absorption, greater than 70 dB, can be realized in such structures. This indicates that coupling strength between the magnetic and acoustic waves is extremely strong. These experiments have also shown that the power absorption scales with increase in film thickness, and the behavior remains consist for a large range of input powers.

Figure 3:
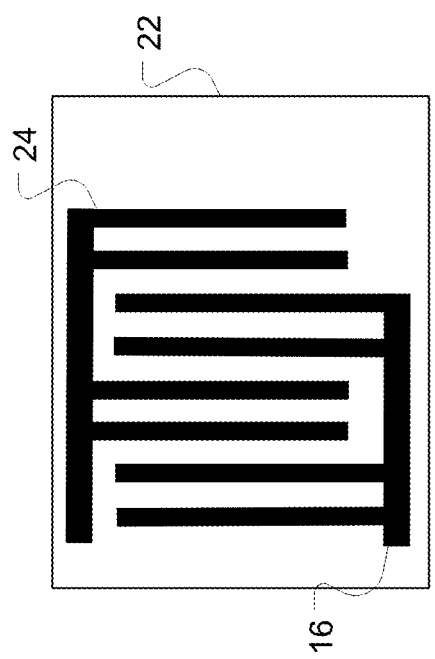
FIG. 3 shows a top view of interdigitated transducers used in a surface acoustic wave ADFMR device and FIG. 4 shows a top view of an ADFMR device with an exploded view of interdigitated transducers.

Generally, the device 20 consists of a substrate 22. In one embodiment, the substrate consists of a Y-cut lithium niobate substrate. These devices use a double-electrode interdigitated transducer (IDT), with electrodes 24 and 26. IDTs can effectively excite surface acoustic waves (SAWs). The double electrode IDTs in this embodiment excite at high harmonics. Normal IDTs also can excite at high harmonics, but suffer from much worse performance. The double electrode design reduces destructive interference cause by reflections with the IDT when operating at higher-order modes by replacing a structure of alternating signal and ground electrodes with one where each signal and ground electrode is replaced by a pair of electrodes with a gap between them. The IDTs are aligned so that the direction of propagation of the SAW s would be along the z-axis of the lithium niobate substrates which allows for all devices to operate the same fundamental frequency and with a consistent SAW mode. FIG. 3 shows a plan view of the IDTs.

Figure 4:
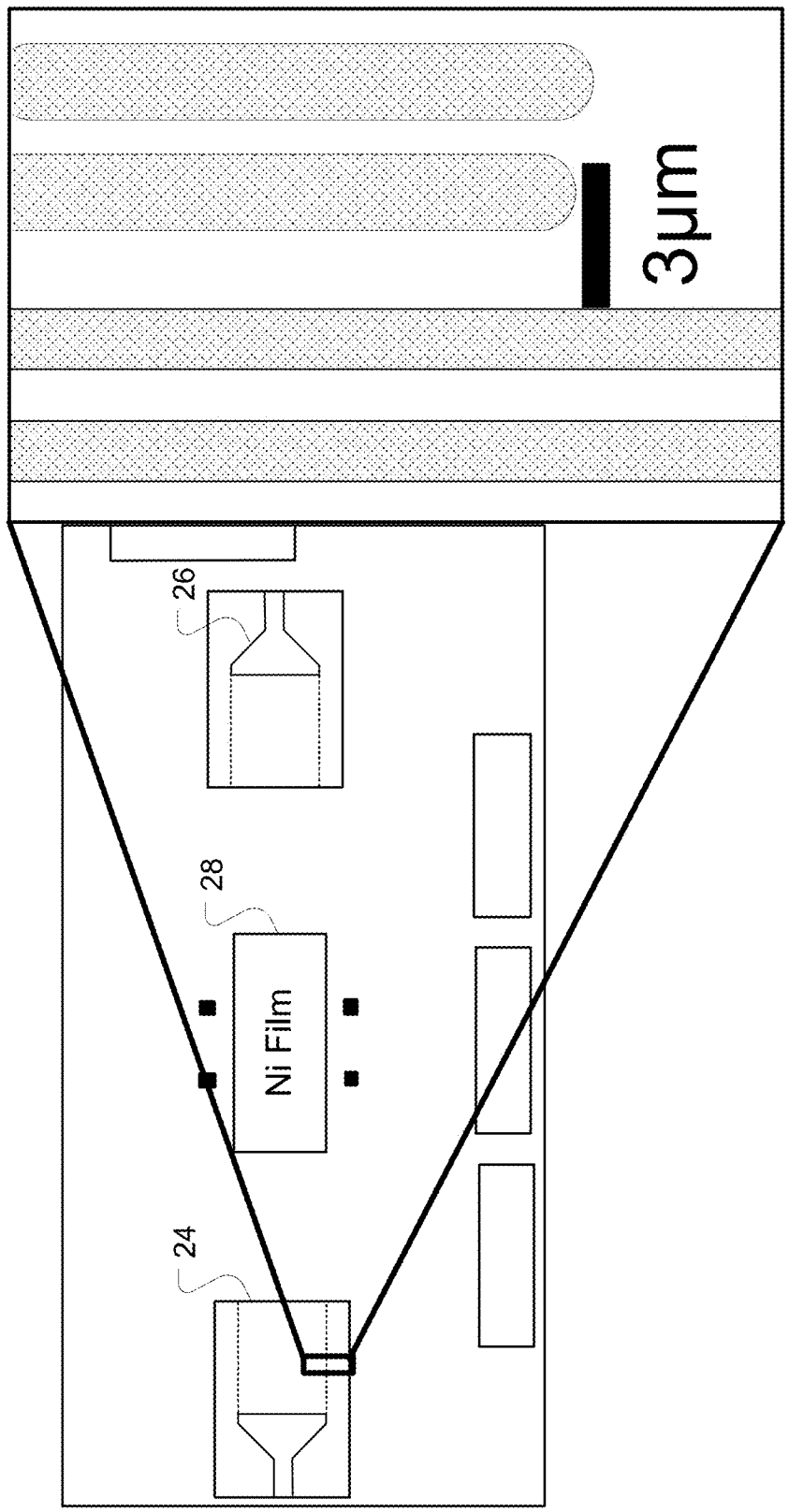

The IDTs are fabricated using multi-step optical lithography. In one embodiment, after the IDT patterning is performed, contacts are formed. In one embodiment, 70 nm of aluminum was deposited via thermal evaporation and a liftoff was performed to create the contacts. A second photolithography step with alignment may be performed to define the magnet regions where the magnetostrictive material 28 will reside between the electrodes 24 and 26. In one embodiment, the magnet region consists of nickel. FIG. 4 shows an embodiment of the substrate 22 having a nickel film 18. The electrode 24 is also shown in an exploded view to the right side of the figure.

In operation, a radio frequency field is applied to one of the IDTs using a voltage source 30. In one embodiment, an AC voltage usually in the gigahertz range is applied to one of these IDTs to create a coherent elastic wave that travels along the surface of the piezoelectric. The time varying strain caused by the SAW is transferred to the element consisting of magnetostrictive material 28, which changes its crystalline anisotropy. The magnetostrictive element 28 may consist of ferromagnetic material, ferrimagnetic material, etc. The SAW interacts with the magnetostrictive element via the magnetoelastic interaction and provides the RF driving field necessary to excite the magnet into resonance. This drives the magnetostrictive element into ferromagnetic resonance. Power absorbed by the magnet can be calculated by reading out the amplitude of the attenuated SAW at the second IDT at 32.

Figure 5:
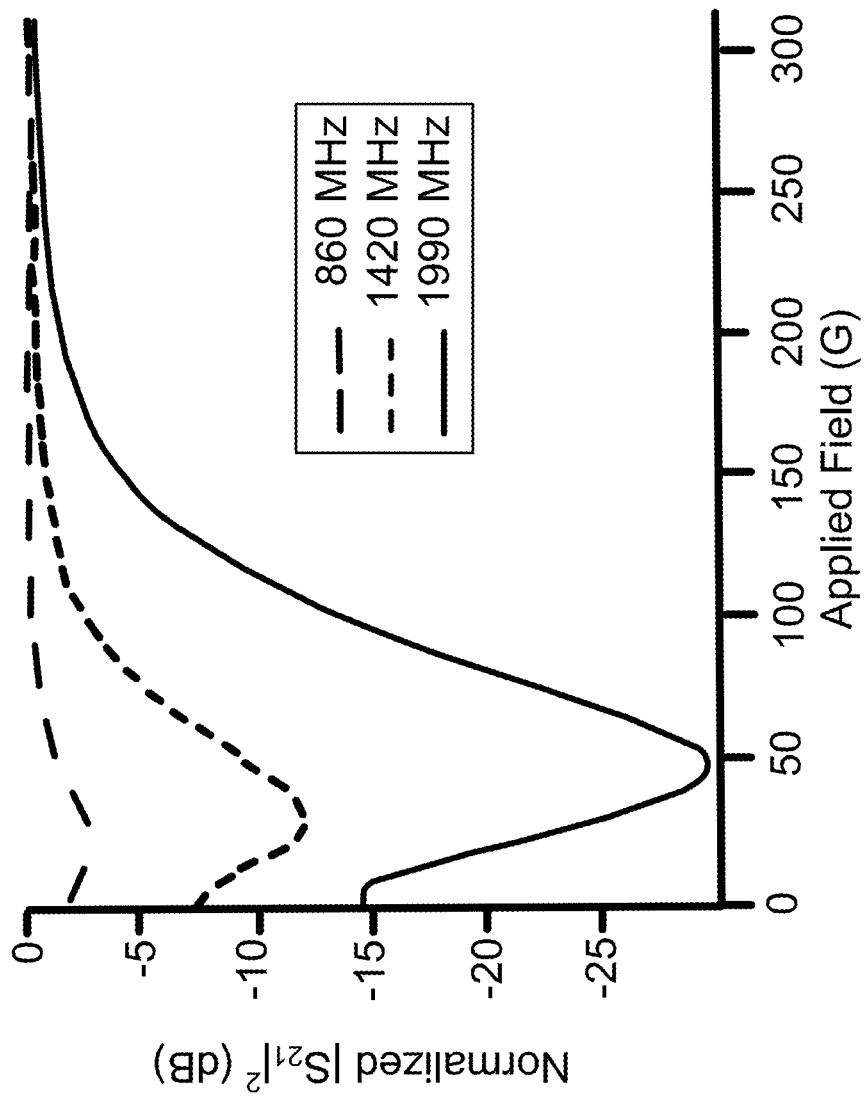
FIGS. 5 and 6 shows graphs of absorption for an ADFMR device.
Figure 6:
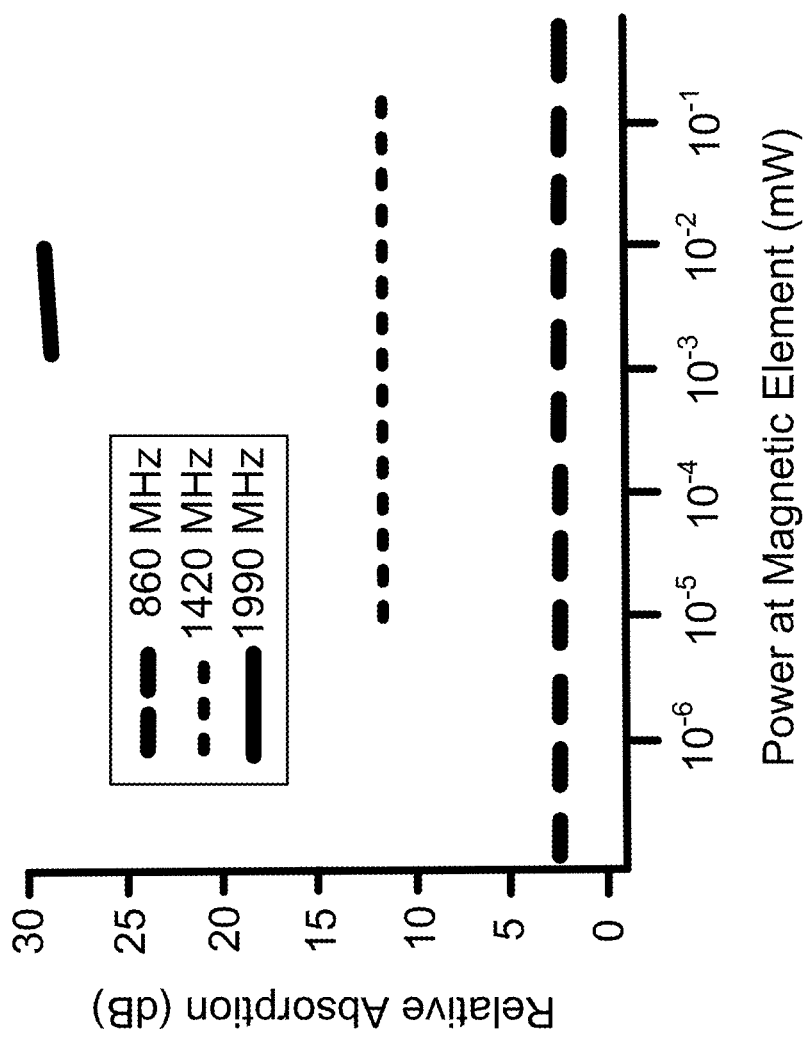

By normalizing the input power and accounting for differing losses at various input frequencies, the devices demonstrate that the relative magnitude of ADFMR absorption increases with increased frequency. This is shown in FIG. 5. In FIG. 5, the curves are of three different frequencies at 0.860 GHz, 1.42 GHz, and 1.990 GHz. The response shows the ADFMR absorption of the transmission power $S_{21}^2$. This result confirms that the power absorption trend seen in ADFMR matches that of the convention FMR in thin films. FIG. 6 shows the relative absorption against power at the magnetic element for the same three frequencies.

In application, the magnetostrictive element begins to strongly absorb the traveling SAW applied to the input IDT and transmitting through the input IDT to the output IDT through the magnetostrictive element. This allows measuring the absorption of the SAW by comparing the input power incident on the generating or input IDT to the power measured on the detection or output IDT. It can be determined whether the magnet has entered FMR and leads to a determination of the magnetic field experienced at the magnetostrictive element.

This effect can be used as an extremely sensitive magnetic field sensor by biasing the magnetic film so that it is very close to entering FMR and then measuring the absorption and/or phase of the SAWs as a function of applied magnetic field. Residing in the Earth's ambient magnetic field, or a zero-magnetic field, puts the sensor close enough to resonance to be used for sensing. This bias can be achieved by using exchange bias, putting an antiferromagnet on top or bottom, or by using dipolar coupling, such as putting another magnetic layer nearby.

Very small changes in the external magnetic field can cause substantial and easily measurable changes in the output power and output phase measurements on the detection IDT. By using industry-standard generation and detection techniques and an input power of 20 mW, the devices will be able to measure magnetic fields on the order of 100 femtoTesla at room temperatures. This beats comparable state of the art devices by several orders of magnitude when considering relevant SWaP metrics.

In the ADFMR embodiments above, the detection circuitry comprises the second transducer and a voltage reader to read out the voltage detected at the second transducer. Other types of detection circuitry may include anisotropic magnetoresistance, in which the detection circuitry measures the resistance of the magnet. Other means of detection include detecting the spin Hall effect by placing a metal that exhibits the spin Hall effect, typically a heavy metal like platinum, on top of, or adjacent to, the magnet and read out the generated voltage. Other forms include optical readout via the magneto-optic Kerr effect. As will be discussed below, one-port resonators like high-tone bulk acoustic resonators (HBAR) and film bulk acoustic resonators (FBAR), the circuitry would measure the impedance of the resonator or the reflection of the signal in the magnet, instead of the transmission at the magnet as done in the SAW geometry.

FIG. 7 shows a prior art example of a FBAR 40. Generally, these devices constitute a cavity in a substrate 42. A first electrode 44 is suspended over the cavity. A piezoelectric (PZT) element 48 resides on the first electrode, suspended over the cavity, and a second electrode 46 resides on the PZT. Generally, once voltage is applied to one of the electrodes, the PZT vibrates and generates an acoustic wave that resonates in the cavity.

Typically, the strain is highest in the middle of the PZT vertically, so one would want to locate the magnetostrictive element, referred to here as a magnet, near high point of the strain. An embodiment of such a device 50 having a magnetostrictive element is shown in FIG. 8. The substrate 52 has a cavity, as in the device of FIG. 7, electrodes 54 and 56 and a piezoelectric element 58. In this embodiment, the PZT element is divided into two parts with the magnet 60 between them. Other architectures are of course possible.

Figure 11:
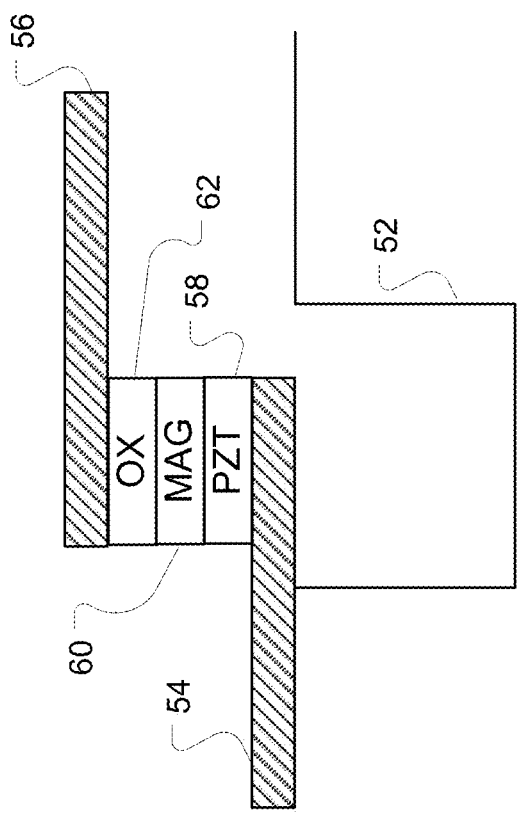

FIG. 9 shows an alternative architecture, in which the magnet 60 resides between the first electrode 54 and the PZT element 58. FIG. 10 shows an embodiment in which the magnet 60 resides outside the electrodes 54 and 56, in either position 60a or 60b. FIG. 11 shows a symmetric structure as in FIG. 8, but the opposite of the magnet 60 from the PZT 58 is a spacer, such as an oxide spacer 62. One should note that the spacer may consist of many different materials, oxide is merely one example.

Figure 12:
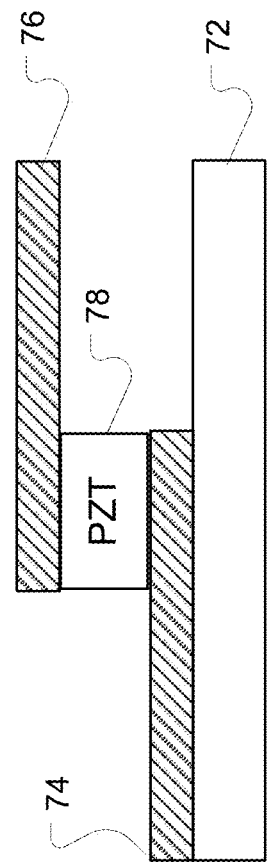
FIGS. 12-16 show embodiments of an ADFMR device in a high-tone bulk acoustic resonator (HBAR).

Alternative acoustic resonators could include high-tone bulk acoustic resonators (HBAR). These devices typically consist of a substrate without a cavity, and the generated acoustic waves either propagate through the substrate or on the surface. FIG. 12 shows a prior art example of such a device. A first electrode 74 resides on the substrate 72, and the PZT element 78 resides between the first electrode 74 and the second electrode 76. Note that the electrodes may also be referred to as transducers. The strain wave has a sinusoidal profile in the substrate.

Figure 14:
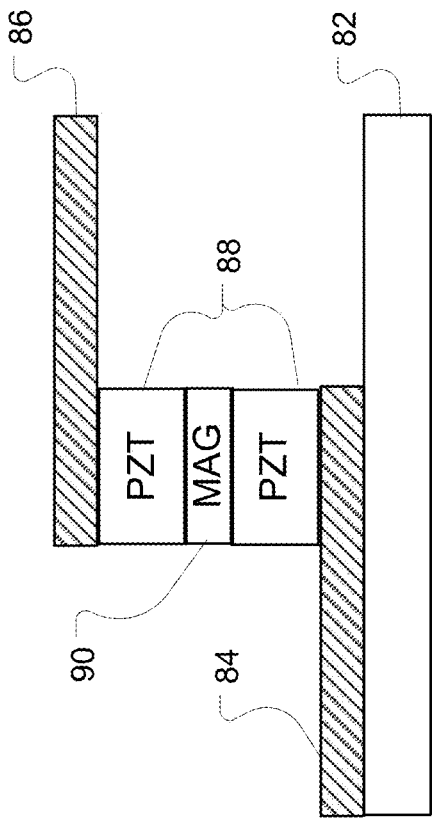
Figure 13:
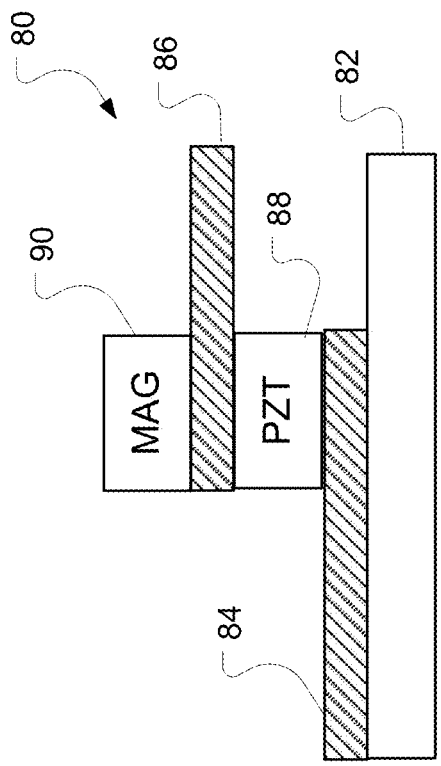
Figure 15:
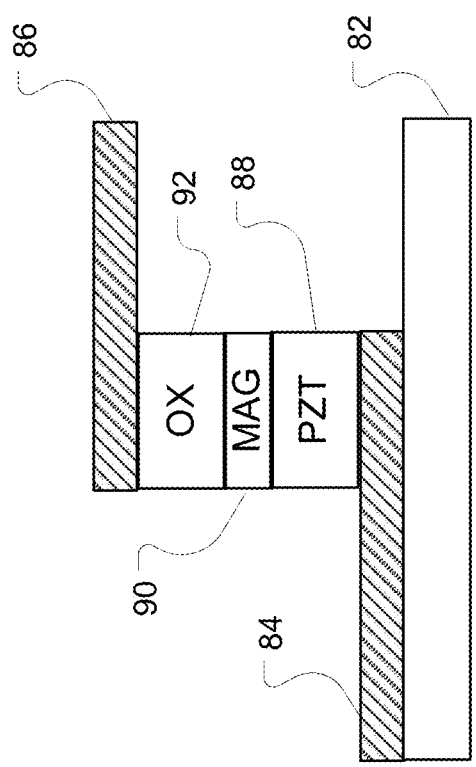
Figure 16:
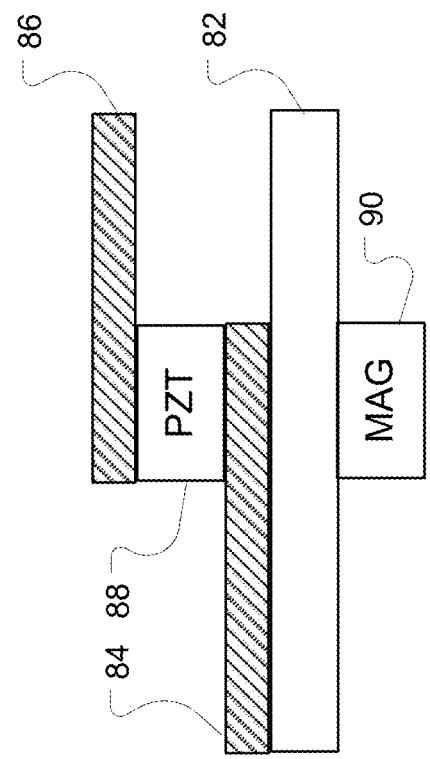

In the embodiments using magnetostrictive elements for detection, the magnet 90 may be placed outside the electrodes as shown in FIG. 13, or in a stack between two pieces of the PZT element 88 as shown in FIG. 14. Other architectures include the magnet 90 in a stack with the PZT 88 and an oxide spacer 92 between the magnet 90 and the second electrode 86 as in FIG. 15. In yet another alternative, the magnet 90 may be located outside the electrodes, and on the opposite surface of the substrate from the electrodes-PZT stack as shown in FIG. 16.

Figure 19:
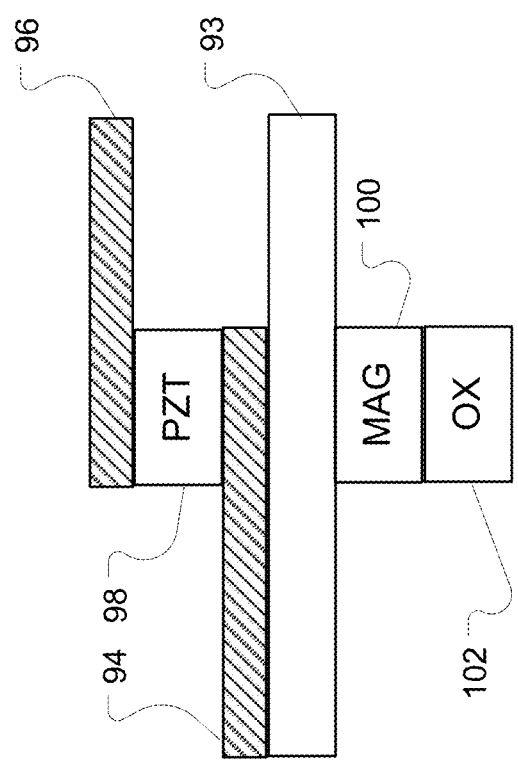

One modification that may occur in any of the device architectures includes a spacer or other structure on the magnetostrictive element. The use of a spacer maximizes the strain on the magnetostrictive element. This may apply to any of the architectures previously discussed, including the FBAR, HBAR and the structure with the IDTs. Adaptations for the FBAR and HBAR structures are shown in FIGS. 17-19.

FIG. 17 shows an embodiment of an FBAR structure having the substrate 93 with the cavity, a first electrode 94, second electrode 96 and the PZT element 98 between them. In this particular structure, the magnet 100 resides on the upper electrode 96. The spacer 102 then resides between the magnet and the air.

FIG. 18 shows a similar variation for the HBAR structure in which the magnet 100 resides on the upper electrode 96 and the substrate 93 does not have a cavity. The spacer 102 resides on the top of the magnet, between the magnet 100 and the air. Similarly, the structure of FIG. 19 has the magnet on the surface of the substrate 93 opposite the surface upon which the lower electrode 94 resides. The spacer 100 resides on the surface of the magnet 100 that would otherwise be exposed to air.

Other variations of the structure could exchange the spacer 102 for a antiferromagnet used for biasing. Additionally, the spacer could be replaced with a heavy metal used as part of the detection circuitry, as mentioned above.

Figure 20:
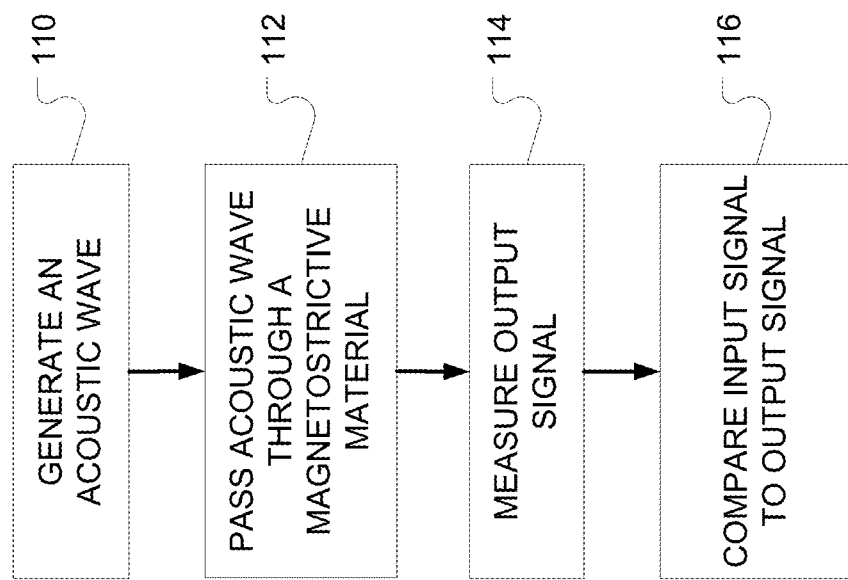
FIG. 20 shows a flowchart of an embodiment of detecting a field strength using a magnetostrictive element.

In summary, the device may consist of acoustically driven ferromagnetic devices includes SAW resonators, HBARs and FBARs. The device may be used to detect changes between input signals and output signals of many types. An embodiment of this is shown in FIG. 20. The piezoelectric element may be a PZT material activated by electrodes acting as transducers, or it may consist of the substrate upon which the transducers reside. The transducers generate an input signal at 110 The detection circuitry may detect a change in the power absorption at the readout one of the transducers, or it may detect anisotropic magnetoresistance, inverse spin Hall effect, optical readout, the impedance of the resonator, or reflection of the signal, among many others, at 112. Other possibilities include tunneling magnetoresistance, anomalous Hall effect, and giant magnetoresistance. The output signal resulting from the input signal passing through the magnetostrictive element is measured by detection circuitry at 114 and the two signals are compared at 116.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. An acoustically driven ferromagnetic resonance (ADFMR) device, comprising:
    a substrate comprising a piezoelectric element comprised of piezoelectric material;
    a pair of interdigitated transducers residing on the piezoelectric element, one of the pair of interdigitated transducers being an input transducer and one of the pair of interdigitated transducers being an output transducer, the input transducer arranged to activate the piezoelectric element to generate an acoustic wave;
    a radio frequency voltage source electrically connected to the input transducer to apply a radio frequency voltage having a frequency of at least 0.86 GHz to the input transducer to generate the acoustic wave at the radio frequency;
    a magnetostrictive element comprised of a magnetostrictive material arranged in a region between the pair of interdigitated transducers and to receive and absorb the acoustic wave, wherein the acoustic wave excites the magnetostrictive element into ferromagnetic resonance (FMR); and
    a readout circuit connected to the output transducer to detect an output voltage having an attenuated amplitude that indicates a change in the acoustic wave amplitude caused by absorption of the acoustic wave by the magnetostrictive element in FMR to measure an unknown magnetic field in which the ADFMR device resides and as experienced by the magnetostrictive element.

2. The ADFMR device of claim 1, wherein the piezoelectric substrate comprises a Y-cut lithium niobate substrate.

3. The ADFMR device of claim 1, further comprising a spacer residing on the magnetostrictive element.

4. The ADFMR device of claim 1, further comprising an antiferromagnet residing on the magnetostrictive element.

5. A method of operating a sensor to detect a magnetic field, comprising:
    placing the sensor in an unknown magnetic field;
    applying a radio frequency voltage in having a frequency of at least 0.86 GHz to one of a pair of interdigitated transducers arranged adjacent a piezoelectric element comprised of a piezoelectric material, the radio frequency voltage to cause the piezoelectric element to generate an acoustic wave that passes through a magnetostrictive element comprised of a magnetostrictive material wherein the acoustic wave excites the magnetostrictive element into ferromagnetic resonance (FMR);
    measuring a change in power of the acoustic wave after passing through and being at least partially absorbed by the magnetostrictive element in FMR by measuring an output voltage amplitude at the other of the pair of interdigitated transducers; and
    determining the unknown magnetic field experienced at the magnetostrictive element based upon the change in the acoustic wave amplitude.

6. The method of claim 5, wherein applying the radio frequency voltage to the one of the pair of interdigitated transducers comprises:
    applying the radio frequency voltage to an input transducer of the pair of the interdigitated transducers to generate a surface acoustic wave, such that the surface acoustic wave passes through and is at least partially absorbed by the magnetostrictive element to an output transducer of the pair of interdigitated transducers; and
    measuring the output voltage amplitude at an output transducer of the pair of interdigitated transducers.

7. The method of claim 6, wherein the one of the pair of interdigitated transducers generates the surface acoustic wave on a piezoelectric substrate upon which the pair of interdigitated transducers resides.

* * * * *